United States Patent
Cyrille et al.

(10) Patent No.: US 8,766,733 B2
(45) Date of Patent: Jul. 1, 2014

(54) MAGNETORESISTIVE RADIOFREQUENCY OSCILLATOR

(75) Inventors: Marie Claire Cyrille, Sinard (FR); Bertrand Delaet, Bernin (FR); Ursula Ebels, Grenoble (FR); Dimitri Houssameddine, Grenoble (FR)

(73) Assignees: Commissariat a l'energie atomique et aux energies alternatives, Paris (FR); Centre National de la Recherche Scientifique, Paris (FR)

( * ) Notice: Subject to any disclaimer, the term of this patent is extended or adjusted under 35 U.S.C. 154(b) by 197 days.

(21) Appl. No.: 13/518,054

(22) PCT Filed: Dec. 20, 2010

(86) PCT No.: PCT/EP2010/070320
§ 371 (c)(1), (2), (4) Date: Sep. 6, 2012

(87) PCT Pub. No.: WO2011/076768
PCT Pub. Date: Jun. 30, 2011

(65) Prior Publication Data
US 2013/0002362 A1 Jan. 3, 2013

(30) Foreign Application Priority Data
Dec. 21, 2009 (FR) .................................... 09 59274

(51) Int. Cl.
*H03B 15/00* (2006.01)
(52) U.S. Cl.
USPC .. 331/94.1; 331/96; 360/324.11; 360/324.12; 365/158; 365/171; 365/173
(58) Field of Classification Search
USPC ......... 331/94.1, 96, 187; 360/324.11, 324.12; 365/158, 171, 173
See application file for complete search history.

(56) References Cited

U.S. PATENT DOCUMENTS 5,583,725 A * 12/1996 Coffey et al. ............ 360/324.11
5,695,864 A    12/1997 Slonezewski (Continued)

FOREIGN PATENT DOCUMENTS

| FR | 2817998 | 6/2002 |
| FR | 2892271 | 4/2007 |
| WO | 2009/130738 | 10/2009 |

OTHER PUBLICATIONS

Baibich M.N. et al., "Giant Magnetoresistance of (001)Fe/(001)Cr Magnetic Superlattices." Nov. 21, 1998, *Physical Review Letters*, vol. 61, No. 21.

(Continued)

*Primary Examiner* — Joseph Chang
*Assistant Examiner* — Jeffrey Shin
(74) *Attorney, Agent, or Firm* — Occhiuti & Rohlicek LLP

(57) ABSTRACT

A radiofrequency oscillator comprises: a free layer (4), a current injector (6) for injecting spin-polarized current into the free layer, this injector having a spin-polarized current injection face (16) directly in contact with the free layer, a magnetoresistive contact (8) having a measurement face (26) directly in contact with the free layer, in order to form, in combination with the free layer, a tunnel junction for measuring the precession of the magnetization of the free layer, a conducting pad (30) directly in contact with the free layer in order to make an electrical current flow through the injector without passing through the magnetoresistive contact. At least part of the measurement face (26) and part of the injection face (16) are placed facing each other on each side of the free layer (4).

17 Claims, 4 Drawing Sheets

(56) References Cited

U.S. PATENT DOCUMENTS

| | | | |
|---|---|---|---|
| 8,194,361 B2 * | 6/2012 | Kudo et al. | 360/324.11 |
| 8,450,818 B2 * | 5/2013 | Nikonov et al. | 257/421 |
| 2007/0259209 A1 | 11/2007 | Slavin et al. | |
| 2008/0094760 A1 | 4/2008 | Lee et al. | |

OTHER PUBLICATIONS

Katine, J.A. et al., "Current-Driven Magnetization Reversal and Spin-Wave Excitations in Co_Cu_Co Pillars." Apr. 3, 2000, *Physical Review Letters*, vol. 84, No. 14.

Kiselev S.I. et al., "Microwave oscillations of a nonomagnet driven by a spin-polarized current." Sep. 25, 2003, *Letters to Nature*, vol. 425.

Moodera, J.S. et al., "Large Magnetoresistance at Room Temperature in Ferromagnetic Thin Film Tunnel Junctions." Apr. 17, 1995, *Physical Review Letters*, vol. 74, No. 16.

Parkin, S.S.P., "Spin engineering: Direct determination of the Ruderman-Kittel-Kasuya-Yosida far-field range function in ruthenium." Oct. 1, 1991, *Physical Review B*, vol. 44, No. 13.

Parkin, S.S.P., "Oscillations in Exchange Coupling and Magnetoresistance in Metallic Superlattice Structures: Co/Ru, Co/Cr, and Fe/Cr." May 7, 1990, *Physical Review Letters*, vol. 64, No. 19.

\* cited by examiner

MAGNETORESISTIVE RADIOFREQUENCY OSCILLATOR

CROSS-REFERENCE TO RELATED APPLICATIONS

This application is the National Stage of International Application No. PCT/EP2010/070320, filed on Dec. 20, 2010, which claims the benefit of the priority date of French Application No. 0959274, filed on Dec. 21, 2009. The content of these applications is hereby incorporated by reference in its entirety.

FIELD OF DISCLOSURE

The invention relates to a radiofrequency oscillator.

The term radiofrequency refers to frequencies of between 1 MHz and a few hundreds of GHz, usually between 1 MHz and 5 GHz.

More particularly, the invention relates to a radiofrequency oscillator incorporating a magnetoresistive device in which a spin-polarized electrical current flows. In such an oscillator, the flow of current causes a periodic variation of the resistance of the magnetoresistive device. A clock signal is formed on the basis of this periodic variation. The period of the resistivity variations, and therefore the oscillation frequency, can be controlled by adjusting the strength of the current which passes through the magnetoresistive device and/or an external magnetic field.

Such oscillators are for example intended to be used in the field of radio telecommunications, because they can generate a wide range of frequencies with a high quality factor.

BACKGROUND

Here, the term quality factor refers to the following ratio:

$$Q=f/\Delta f$$

where:
  Q is the quality factor,
  f is the oscillation frequency of the oscillator, and
  $\Delta f$ is the full width at half maximum of the line centered on the frequency f in the power spectrum of this oscillator.

Radiofrequency oscillators have derived from spin electronics.

Spin electronics uses the spin of the electrons as an additional degree of freedom in order to generate new effects. The spin polarization of an electrical current results from the asymmetry existing between the mobility of the conduction electrons of the "spin-up" type (that is to say parallel to the local magnetization) and of the "spin-down" type (that is to say antiparallel to the local magnetization). This asymmetry leads to an asymmetry of the conductivity between the two channels, spin-up and spin-down, giving a net spin polarization of the electrical current.

This spin polarization of the current gives rise to magnetoresistive phenomena in magnetic multilayers such as giant magnetoresistance (Baibich, M., Broto, J. M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys. Rev. Lett., 61 (1988) 2472), or tunnel magnetoresistance (Moodera, J S., Kinder, L R., Wong, T M. and Meservey, R., "*Large magnetoresistance at room temperature in ferromagnetic thin film tunnel junctions*", Phys. Rev. Lett 74, (1995) 3273-6).

Furthermore, it has also been observed that, by passing a spin-polarized current through a thin magnetic film, reversal of its magnetization can be induced in the absence of any external magnetic field (Katine, J. A., Albert, F. J., Buhrman, R. A., Myers, E. B., and Ralph, D. C., "*Current-Driven Magnetization Reversal and Spin-Wave Excitations in Co/Cu/Co Pillars*", Phys. Rev. Lett. 84, 3149 (2000).).

The polarized current can also generate sustained magnetic excitations, also called oscillations (Kiselev, S. I., Sankey, J. C., Krivorotov, L N., Emley, N. C., Schoelkopf, R. J., Buhrman, R. A., and Ralph, D. C., "*Microwave oscillations of a nanomagnet driven by a spin-polarized current*"; Nature, 425, 380 (2003)). Using the effect of generating sustained magnetic excitations in a magnetoresistive device makes it possible to convert this effect into an electrical resistance modulation which can be used directly in electronic circuits, and can therefore directly affect the frequency. Document U.S. Pat. No. 5,695,864 describes various elements employing the physical principle mentioned above. It describes, in particular, the precession of the magnetization of a magnetic layer through which a spin-polarized electrical current passes. The physical principles involved, as well as the terminology used, are also described and defined in Patent Application FR 2 892 271.

The oscillation frequency of these radiofrequency oscillators is varied by adjusting the strength of the current passing through them, and optionally also an external magnetic field.

Patent Application US 2007/0 259 209 describes a radiofrequency oscillator comprising:
  a free layer, the magnetization of which precesses when a spin-polarized current passes through it perpendicularly to its plane,
  an injector of spin-polarized current into the free layer in order to make its magnetization precess in a sustained fashion, this injector having a spin-polarized current injection face directly in contact with the free layer,
  a magnetoresistive contact having a measurement face directly in contact with the free layer in order to form, in combination with the free layer, a tunnel junction making it possible to measure the precession of the magnetization of the free layer,
  a conductive pad directly in contact with the free layer in order to make an electrical current flow through the injector without passing through the magnetoresistive contact.

The conductive pad is particularly advantageous. This is because without it all of the current passing through the injector would also have to pass through the tunnel junction. The resistivity of the tunnel junction would then need to be low enough to be able to withstand the high current densities necessary for precession without breakdown. Tunnel junctions of low resistivity would need to have a very thin barrier (for example less than one nanometer).

The tunnel barrier is a layer of nonmagnetic material making it possible to magnetically isolate a reference layer of the magnetoresistive contact from the free layer while preserving the spin polarization of the current which passes through it.

Nonmagnetic materials are defined here as materials not having a measurable magnetization in the absence of an external magnetic field. They may for example be materials with no magnetic property, or paramagnetic materials or diamagnetic materials.

A very thin tunnel barrier corresponds to a very low RA factor. The RA factor is the product of the resistance of the tunnel barrier and its area (here, the area is the surface area of the cross section of the tunnel barrier).

When the RA factor of the tunnel barrier is lower, the variation range of the resistivity of the tunnel junction is commensurately smaller (for example less than 10%) and the sensitivity of the tunnel junction to the precession of the magnetization in the free layer is commensurately less.

It will therefore be understood that in the absence of this conductive pad, an apparently insoluble physical contradiction would exist since the tunnel barrier needs to be both thin and thick, which makes it necessary to resort to unsatisfactory compromises.

SUMMARY

Although the radiofrequency oscillator described in Application US 2007/0 259 209 functions correctly, it is an object of the invention to improve it even further.

It therefore relates to a radiofrequency oscillator in which at least a part of the measurement face and a part of the injection face are arranged opposing one another on either side of the free layer.

The amplitude of the precession of the magnetization of the free layer is highest just in front of the injection face and is attenuated rapidly on the sides of this injection face. For this reason, the sensitivity of the magnetoresistive contact is enhanced by measuring the precession of the magnetization of the free layer opposing the injection face.

The embodiments of this radiofrequency oscillator may comprise one or more of the following characteristics:
- the oscillator comprises at least one current source which is electrically connected to the injector and/or to the magnetoresistive contact in order to make current flow through the parts of the measurement and injection faces which oppose one another;
- the measurement face extends beyond the injection face;
- the surface area of the measurement face is at least two times greater than the surface area of the injection face;
- the injection face extends beyond the measurement face in the direction of the conductive pad;
- the entire measurement face and the entire injection face are arranged opposing one another;
- the oscillator comprises a current source to which the conductive pad and the magnetoresistive contact are connected in parallel;
- the RA factor of the tunnel barrier of the magnetoresistive contact is greater than 1 $\Omega\mu m^2$ and preferably greater than 20 or 50 $\Omega\mu m^2$;
- the injector comprises a polarizer which is adapted to spin-polarize the current which passes through it perpendicularly to the plane of its layer and whose direction of easiest magnetization is perpendicular to the plane of the free layer;
- the injector comprises a polarizer and a conductive nonmagnetic layer adapted to magnetically decouple the polarizer from the free layer, so that the stack consisting of the polarizer, the conductive nonmagnetic layer and the free layer forms a giant magnetoresistance;
- the injector comprises a polarizer and an insulating nonmagnetic layer adapted to magnetically decouple the polarizer from the free layer, so that the stack consisting of the polarizer, the insulating nonmagnetic layer and the free layer forms a tunnel junction;
- the polarizer is a synthetic antiferromagnetic; and
- the free layer is a synthetic antiferromagnetic.

These embodiments of the radiofrequency oscillator furthermore have the following advantages:
- having the measurement face extending beyond the injection face increases the sensitivity of the magnetoresistive contact even further;
- having the injection face extending beyond the measurement face also increases the sensitivity of the radiofrequency oscillator;
- having the entire measurement face and the entire injection face arranged opposing one another increases the sensitivity of the radiofrequency oscillator because the precession of the magnetization is measured only where it is maximal;
- connecting the conductive pad and the magnetoresistive contact in parallel to the same current source makes it possible to use only a single current source in order to generate both the current which passes only through the injector and the current which passes through the injector and the magnetoresistive contact;
- using a polarizer whose direction of easiest magnetization is perpendicular to the plane of the free layer makes it possible to improve the amplitude of the precession of the magnetization in the free layer and to generate oscillations without having to apply an external magnetic field;
- using the face of a barrier made of insulating nonmagnetic material in order to form the injection face increases the sensitivity of the radiofrequency oscillator even further because the current lines widen more in order to overcome this barrier, which makes it possible to be sensitive to the precession of the magnetization of the free layer over a surface larger than the surface area of the injection face.

BRIEF DESCRIPTION OF THE FIGURES

The invention will be better understood on reading the following description, given only by way of nonlimiting example and provided with reference to the drawings, in which.

In these figures, the same references are used to denote elements which are the same.

DETAILED DESCRIPTION

In the rest of this description, the characteristics and functions well known to the person skilled in the art are not described in detail. In particular, for further details regarding the way of producing the various layers of the radiofrequency oscillators described here, and in particular regarding the materials which can be used for this purpose, reference may be made to Patent Application FR 2 892 271.

In the rest of this description, the terms "upper", "lower", "top" and "bottom" are defined with respect to the vertical direction represented by an arrow V in the figures.

Figure 1:
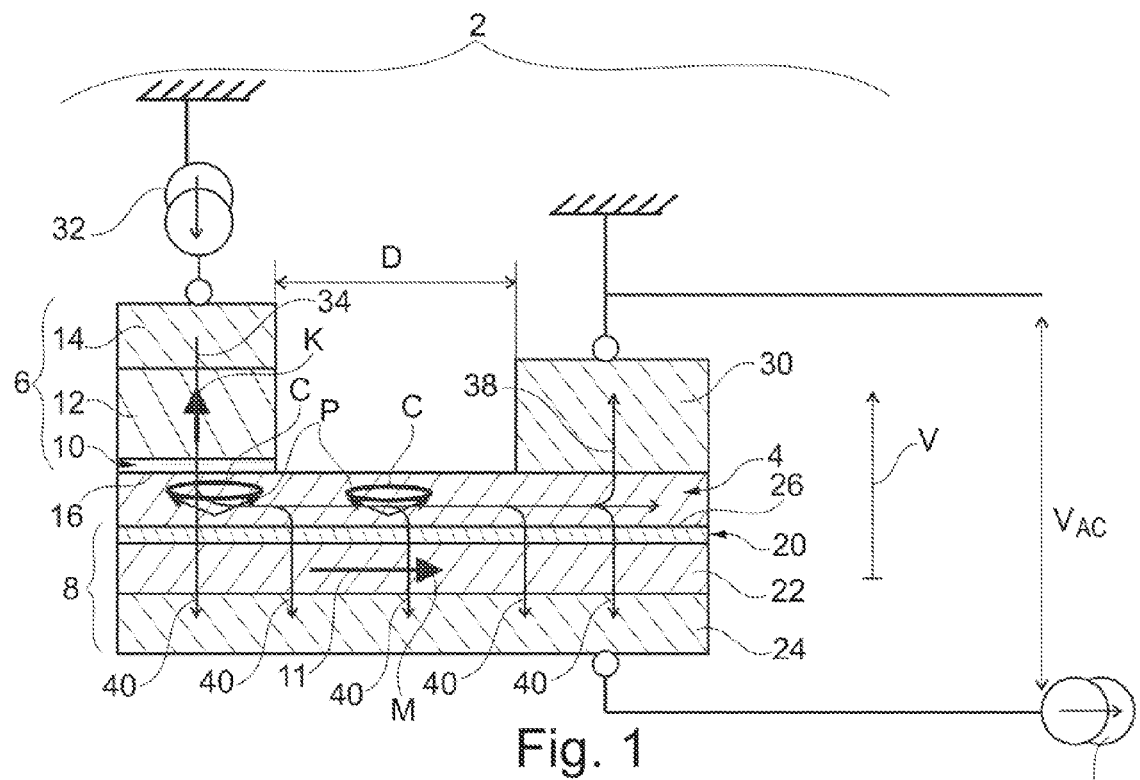
FIG. 1 is a schematic illustration in vertical section of a first embodiment of a radiofrequency oscillator.

FIG. 1 represents a radiofrequency oscillator 2 in vertical section.

The oscillator 2 comprises a horizontal free layer 4, above which an injector 6 is arranged and below which a magnetoresistive contact 8 is arranged.

The layer 4 is a layer whose magnetization precesses when a spin-polarized current passes through it perpendicularly to its plane. This precession is sustained when the strength of the spin-polarized current exceeds the strength of a critical current $I_c$. In FIG. 1, as in the subsequent figures, the precession of the magnetization of the layer 4 is symbolized by arrows P, the ends of which describe a circle C. The diameter of this circle C is representative of the amplitude of the precession of the magnetization of the layer 4.

The layer 4 is typically made of an electrically conductive magnetic material. For example, the layer 4 is made of Permalloy, or NiFe or CoFe or CoFeB alloy, or is formed by a combination of two or more layers such as NiFe/CoFe. This layer 4 is a soft magnetic layer, that is to say one whose magnetization can easily be aligned under the effect of a weak external field.

Here, the greatest dimension of the layer 4 in a horizontal plane is typically less than 10 µm and preferably less than 1 µm. This greatest dimension is for example greater than 100 nm. Here, the layer 4 has the shape of a horizontal disk. Other shapes are however possible, such as a rectangular shape.

The injector 6 makes it possible to inject, into the free layer 4, a spin-polarized current which is capable of triggering sustained precession of the magnetization of this layer 4. Here, the injector 6 is in the form of a pillar whose horizontal section is constant. For example, its horizontal section is circular. The greatest horizontal dimension of this pillar is at least two times, and preferably at least three times, less than the greatest dimension of the free layer 4. For example, the diameter of the pillar is approximately four times less than the diameter of the free layer 4.

The injector 6 is arranged in proximity to the outer periphery of the layer 4.

For example, the injector 6 is formed by stacking the following layers, from bottom to top:
 a spacer 10,
 a polarizer 12, and
 a conductive electrode 14.

The polarizer 12 spin-polarizes the current which passes through it vertically. To this end, it is typically a layer made of a conductive magnetic material, the thickness of which is sufficient to spin-polarize the electrons which pass through it vertically. For example, the thickness of the polarizer 12 lies between 5 nm and 100 nm.

The direction of easiest magnetization of the polarizer 12 is perpendicular to the plane of the layer 4 and represented by an arrow K.

For further information regarding the production of such a polarizer, reference may be made to Patent Application FR 2 817 998.

The spacer 10 makes it possible to magnetically decouple the polarizer 12 from the free layer 4 while preserving the spin polarization of the current which passes through it vertically. To this end, the thickness of the spacer 10 is selected expediently in order to fulfill these functions. This spacer 10 has an upper face in contact with the polarizer 12 and a lower face 16, here called the "injection face", directly in contact with the upper face of the free layer 4.

Here, the spacer 10 is made of an electrically conductive nonmagnetic material so that the combination of the injector 6 and the free layer 4 forms a giant magnetoresistance (better known by the acronym GMR). For example, the spacer 10 is made of a metal such as copper.

The electrode 14 arranged on the polarizer 12 makes it possible to connect the injector 6 to a current source or to a reference potential such as ground.

The magnetoresistive contact 8 makes it possible to measure the precession of the magnetization of the layer 4. More precisely, the combination of this magnetoresistive contact 8 with the layer 4 acts as a transducer capable of converting the precession of the magnetization of the layer 4 into a resistance variation.

To this end, the combination of the magnetoresistive contact 8 and the free layer 4 forms a tunnel junction or TMR (Tunnel MagnetoResistance).

Here, the contact 8 is structured in the form of a pillar whose horizontal section is constant. More precisely, this contact 8 is configured so as to cover the entire lower face of the layer 4. The contact 8 therefore has the same diameter as the free layer here. This diameter is typically at least three times greater than the diameter of the injection face 16.

The contact 8 is formed by successively stacking the following three layers:
 a tunnel barrier 20,
 a reference layer 22, and
 a conductive electrode 24.

The reference layer 22 has a magnetization direction which is fixed with respect to that of the free layer 4. Here, this magnetization direction represented by an arrow M is parallel to the plane of the layer 4. This layer 22 may be a relatively thick single layer (from a few nanometers to a few tens of nanometers, typically of the order of 20 nm) made of cobalt, or CoFe or NiFe alloy, for example. The layer 22 is used as a reference layer for the reading of the magnetoresistance. It therefore needs to be magnetically more stable than the layer 4, that is to say its polarization needs to be more difficult to modify than that of the layer 4. To this end, for example, its thickness is adjusted. Conversely, the layer 22 does not have the function of spin polarizing the electrons which pass through it.

In order to reduce the thickness of this layer 22, it may also be laminated by inserting a few (typically 2 to 4) very thin layers of copper, silver or gold with a thickness of the order of 0.2 to 0.5 nm. These inserted layers are sufficiently thin to ensure strong exchange coupling throughout the laminated layer, so that the pinning of this layer remains strong.

The typical composition of such a laminated reference layer may be $(CoFe\ 1\ nm/Cu\ 0.3\ nm)_3/CoFe\ 1\ nm$. This reference layer may also consist of a synthetic antiferromagnetic, better known by the acronym SAF, of the type (CoFe 3 nm/Ru 0.7 nm)/CoFe 2.5 nm.

A synthetic, or artificial, antiferromagnetic is a stack of at least two ferromagnetic sublayers, each sublayer being magnetically coupled to each adjacent ferromagnetic sublayer by antiferromagnetic RKKY (Ruderman-Kittel-Kasuya-Yosida) coupling. Furthermore, the ferromagnetic sublayers of a synthetic antiferromagnetic are dimensioned so that the overall magnetization of the synthetic antiferromagnetic is zero in the absence of an external magnetic field.

In order to obtain RKKY coupling, the ferromagnetic sublayers are separated from one another by thin nonmagnetic sublayers.

Depending on the thickness of the nonmagnetic sublayer, the RKKY coupling obtained is:
 either "antiferromagnetic", that is to say the magnetic moments of the two coupled sublayers are antiparallel,
 or "ferromagnetic", that is to say the magnetic moments of the two coupled sublayers are parallel.

In a synthetic antiferromagnetic, the thickness of the nonmagnetic sublayer or sublayers is systematically selected in order to obtain antiferromagnetic RKKY coupling.

For further information regarding RKKY coupling, reference may be made to the following two articles: S. Parkin et al., Physical Review B 44 No 13 (1991) and S. Parkin et al. Physical Review Letters 64 No 19 (1990).

The reference layer may also be pinned by an antiferromagnetic layer so as to fix its magnetization in a particular direction. Such an antiferromagnetic layer may be made of $Ir_{20}Mn_{80}$ with a thickness of 6 to 10 nm or of $Pt_{50}Mn_{50}$ with a thickness of between 15 and 30 nm.

The barrier 20 fulfills substantially the same function as the spacer 10. It is typically made of an electrically insulating nonmagnetic material. Here, for example, the barrier 20 is made of magnesium oxide (MgO) with a thickness of from 0.5 to 3 nm. This barrier could also be made of aluminum oxide (alumina $Al_2O_3$) with a thickness of between 0.5 and 1.5 nm.

This barrier 20 has an upper face 26, here called the "measurement face", directly in contact with the lower face of the free layer 4. This face 26 therefore extends beyond the face 16 in a horizontal direction and, more precisely, in the direction of a conductive pad 30. Typically, the diameter of the face 26 is at least two times, and preferably at least three times, greater than that of the face 16.

The lower face of the barrier 20 is directly in contact with the reference layer 22.

Because of its dimensions, the barrier 20 has an RA factor which is high, that is to say at least greater than 1 or 5 $\Omega\mu m^2$, and preferably greater than 20 or 50 $\Omega\mu m^2$. This high RA factor increases the sensitivity of the radiofrequency oscillator 2.

The electrode 24 is arranged under the reference layer 22. It makes it possible to electrically connect the contact 8 to a current source or to a reference potential.

Because the horizontal dimensions of the free layer 4 are several times greater than the horizontal dimensions of the face 16, a part of the upper face of the layer 4 is not occupied by the injector 6. The conductive pad 30 is deposited directly on this exposed part of the upper face of the layer 4. This pad 30 makes it possible to make current flow through the injector 6 while limiting the amount of current which passes through the contact 8. Typically, this pad 30 is arranged in proximity to the periphery of the layer 4, directly opposite the injector 6. Thus, the pad 30 is separated from the injector 6 by a horizontal distance D at least greater than 20 nm. Typically, the distance D is also less than 500 nm or 1 μm.

Here, the pad 30 has the shape of a circular vertical pillar whose diameter lies, for example, between 50 and 150 nm.

The pad 30 is made of a nonmagnetic metallic material, for example copper.

Here, the pad 30 is connected to ground.

The oscillator 2 also comprises a current source 32, which is adapted to generate an electrical current that passes through the injector 6. To this end, the current source 32 is connected directly to the electrode 14 of the injector 6. The current generated by the source 32 flows through the injector 6, passing from top to bottom as represented by the current line 34.

Here, the oscillator 2 also comprises another current source 36, which is adapted to generate a current through the magnetoresistive contact 8 in order to carry out reading of the working signal. The source 36 is designed so that the strength of the current which passes through the magnetoresistive contact 8 is at least two times, and preferably at least ten times, less than that of the current which passes through the injector 6.

During operation of the oscillator 2, the injector 6 spin-polarizes the current generated by the source 32. This spin-polarized current then causes precession of the magnetization of the free layer 4. This precession of the magnetization propagates into the free layer 4 from the injection surface 16, while being increasingly attenuated further away from the injection face.

Given that the layer 4 and the pad 30 are made of highly conductive materials, most of the current which passes through the injector 6 flows through the layer 4 then the pad 30, before reaching ground. This is represented by a current line 38.

In parallel, the current injected by the current source 36, with a strength much less than the current flowing in the pad 30, passes through the tunnel barrier 20, thus making it possible to measure the magnetoresistance. The variation of the resistance of the tunnel junction due to the precession of the magnetization of the free layer 4 can thus be measured. For example, this resistance variation is represented by the variation of a voltage $V_{AC}$ between ground and the electrode 24.

Because the injection face 16 opposes the measurement face 26, the magnetoresistive contact 8 is sensitive to the precession of the magnetization of the layer 4 which has the greatest amplitude. This therefore contributes to increasing the sensitivity of the oscillator 2.

Furthermore, given that the magnetoresistive contact has a resistivity much higher than that of the pad 30, it is considered that the current lines which pass through this contact 8 tend to spread out at the barrier 20, as represented by the arrows 40. Thus, the magnetoresistive contact is sensitive not only to the precession of the magnetization just vertically in line with the injector 6, but also to the precession of the magnetization throughout the layer 4. This also increases the sensitivity of the oscillator 2.

Finally, the RA factor of the barrier 20 is high here.

Figure 2:
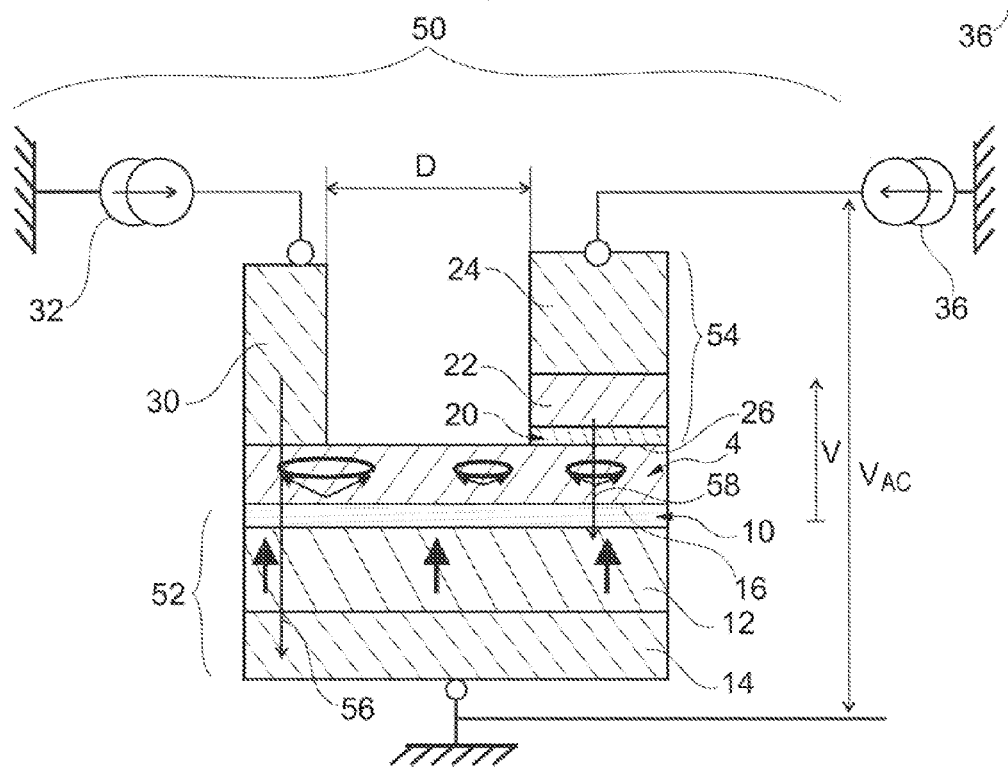
FIGS. 2 to 6 and FIG. 8 are schematic illustrations in vertical section of other embodiments of a radiofrequency oscillator.

FIG. 2 represents an oscillator 50 which is similar to the oscillator 2 but in which the positions of the injector and of the magnetoresistive contact have been reversed relative to those represented in FIG. 1. More precisely, the radiofrequency oscillator 50 comprises an injector 52 located under the free layer 4 and a magnetoresistive contact 54 located on the free layer 4.

The injector 52 is, for example, identical to the injector 6 except for the fact that its diameter is equal to the diameter of the free layer 4, so that the injection face 16 covers all of the lower face of the layer 4.

The contact 54 is, for example, identical to the contact 8 except that its diameter is at least two times, and preferably at least three times, less than the diameter of the free layer 4. Under these conditions, the injection face 16 extends beyond the measurement face 26 in the direction of the pad 30. For example, the face 16 has a diameter at least three times greater than that of the measurement face.

The contact 54 lies diametrically opposite the pad 30, so as to be separated therefrom by a distance D. As before, this distance D is greater than 20 nm, and preferably less than 1 μm or 500 nm.

In this embodiment of the radiofrequency oscillator 50, the current source 32 is connected directly to the pad 30, while the electrode 14 is connected to ground.

The current source 36, for its part, is still connected directly to the electrode 24. Current lines 56 and 58 illustrate the flow of current in the oscillator 50.

In this embodiment, given that the measurement face opposes the injection face, the sensitivity of the oscillator is enhanced. Furthermore, since the layer 10 is conductive, the propagation of the precession of the magnetization in the layer 4 makes it possible to amplify the precession of the magnetization in line with the measurement face 26.

Figure 3:
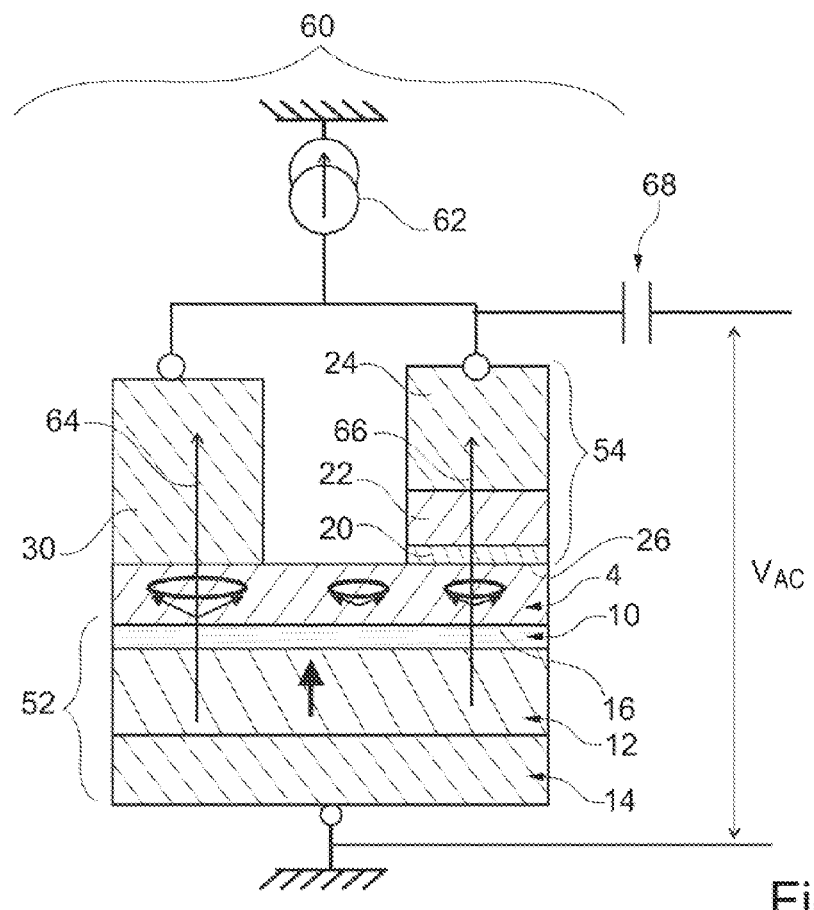

FIG. 3 represents a radiofrequency oscillator 60 which is identical to the radiofrequency oscillator 50 except for the fact that only a single current source 62 is used in order to make the current flow through the pad 30 and the magnetoresistive contact 54. Here, the current source 62 is connected directly to the pad 30 and to the electrode 24 of the contact 54.

Thus, the pad 30 and the contact 54 are connected in parallel to the terminals of the source 62.

Current lines 64 and 66 illustrate the flow of current in the oscillator 60. The voltage $V_{AC}$ between the electrode 24 and the electrode 14 is representative of the precession of the magnetization in the layer 4. A capacitor 68 isolates the terminals, between which the voltage $V_{AC}$ is measured, from the electrode 24.

Figure 4:
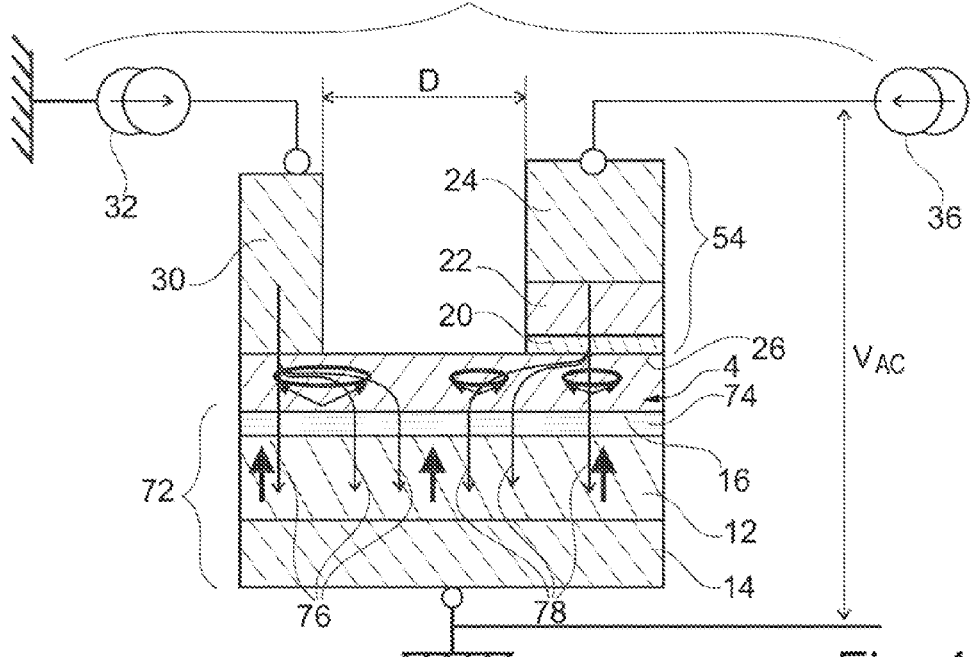

FIG. 4 represents a radiofrequency oscillator 70 which is identical to the radiofrequency oscillator 50 except for the fact that the injector 52 is replaced by an injector 72.

The injector 72 is, for example, identical to the injector 52 except that the spacer 10 is replaced by a tunnel barrier 74 made of an electrically insulating nonmagnetic material. Typically, this barrier 74 has a low resistivity. For example, the RA factor of the barrier 74 is strictly less than 5 $\Omega\mu m^2$. The resistivity of the barrier 74 does, however, remain very much higher (for example ten times higher) than the resistivity of a spacer made of an electrically conductive nonmagnetic material.

It is considered that this increased resistivity of the barrier 74 causes spreading of the current lines at the interface between the injection face 16 and the free layer 4, as represented by the arrows 76 and 78. This spreading of the current lines at this interface improves the sensitivity of the oscillator 70.

Figure 5:
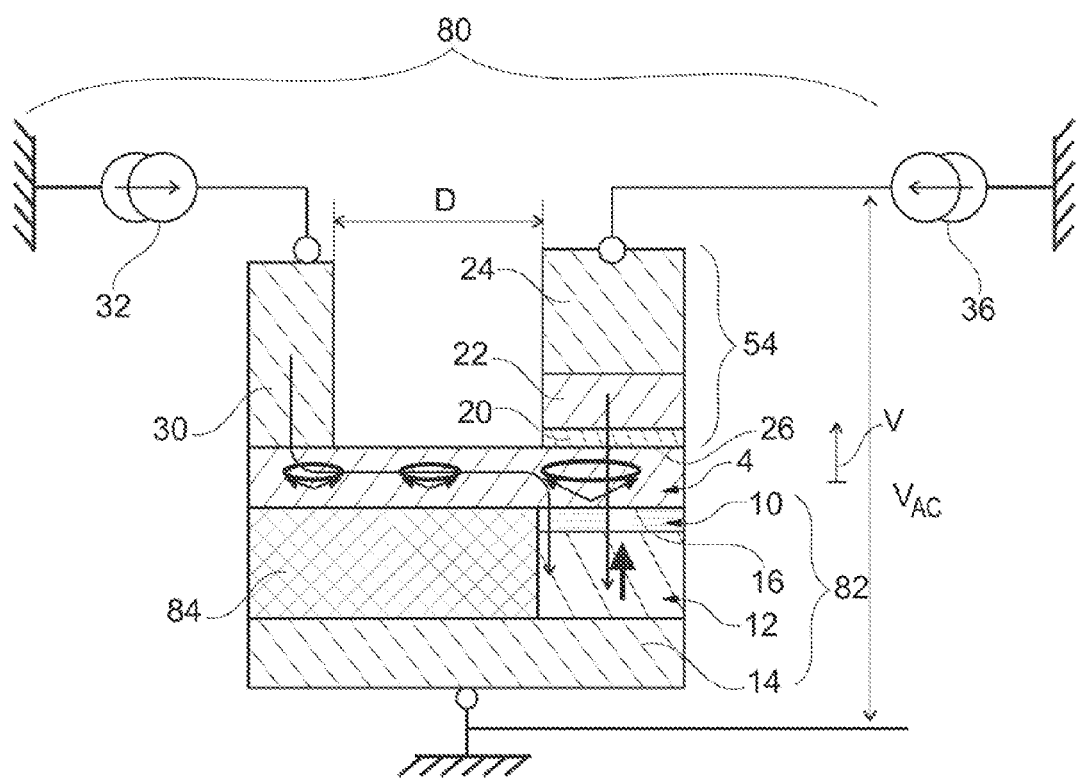

FIG. 5 represents a radiofrequency oscillator 80 which is identical to the radiofrequency oscillator 50 except for the fact that the injector 52 is replaced by an injector 82. The injector 82 is identical to the injector 52 except that it is formed so that the entire injection face 16 and the entire measurement face 26 oppose one another on either side of the layer 4.

To this end, for example, the diameter of the spacer 10 and of the polarizer 12 is reduced and equal to the diameter of the measurement face 26. The free space which is located below the layer 4, and which is freed by the reduction of the diameter of the spacer 10 and of the polarizer 12, is for example filled with an electrically insulating nonmagnetic material such as a dielectric 84.

In this embodiment, the precession of the magnetization in the layer 4 is measured only at the position where its amplitude is maximal. This improves the sensitivity of the radiofrequency oscillator 80. In this embodiment, furthermore, the distance D which separates the magnetoresistive contact 54 from the pad 30 is arbitrary.

Figure 6:
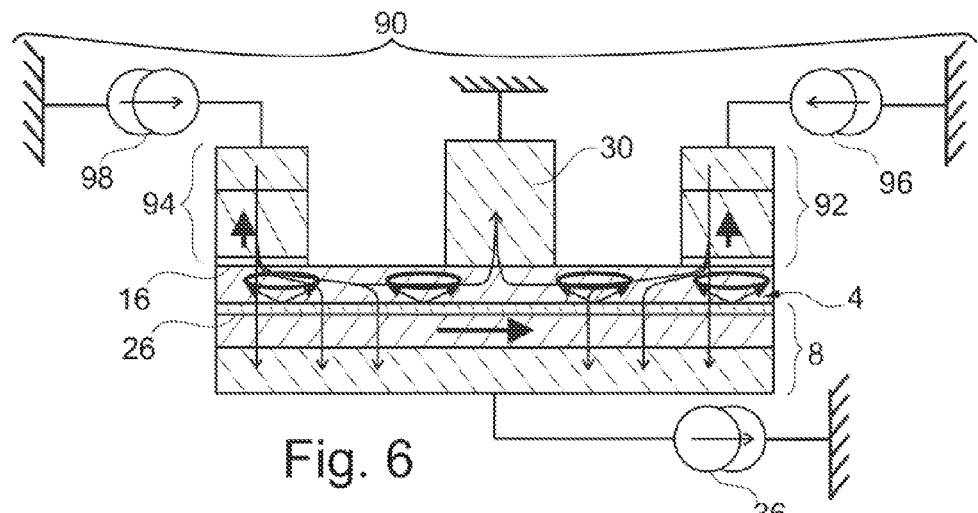
Figure 7:
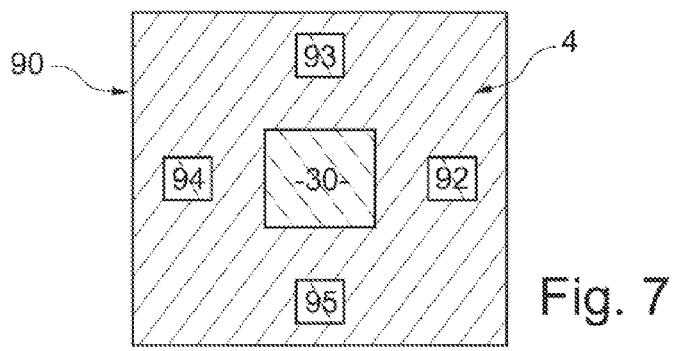
FIG. 7 is a schematic illustration in horizontal section of the embodiment of the radiofrequency oscillator in FIG. 6.

FIGS. 6 and 7 represent a radiofrequency oscillator 90 which is identical to the radiofrequency oscillator 2 except that the injector 6 is replaced by a plurality of injectors, which are arranged on the upper face of the layer 4. By way of illustration, the injector 6 is replaced here by four injectors 92 to 95 distributed regularly around the pad 30. For example, each injector 92 to 95 is identical to the injector 6.

Here, each injector 92 to 95 is connected to its own current source. Only two current sources 96 and 98 are represented in FIG. 6.

The operation of this oscillator 90 derives from the operation of the oscillator 2.

The use of a plurality of injectors makes it possible to increase the quality factor and the power of the signal measured by the magnetoresistive contact 8.

Figure 8:
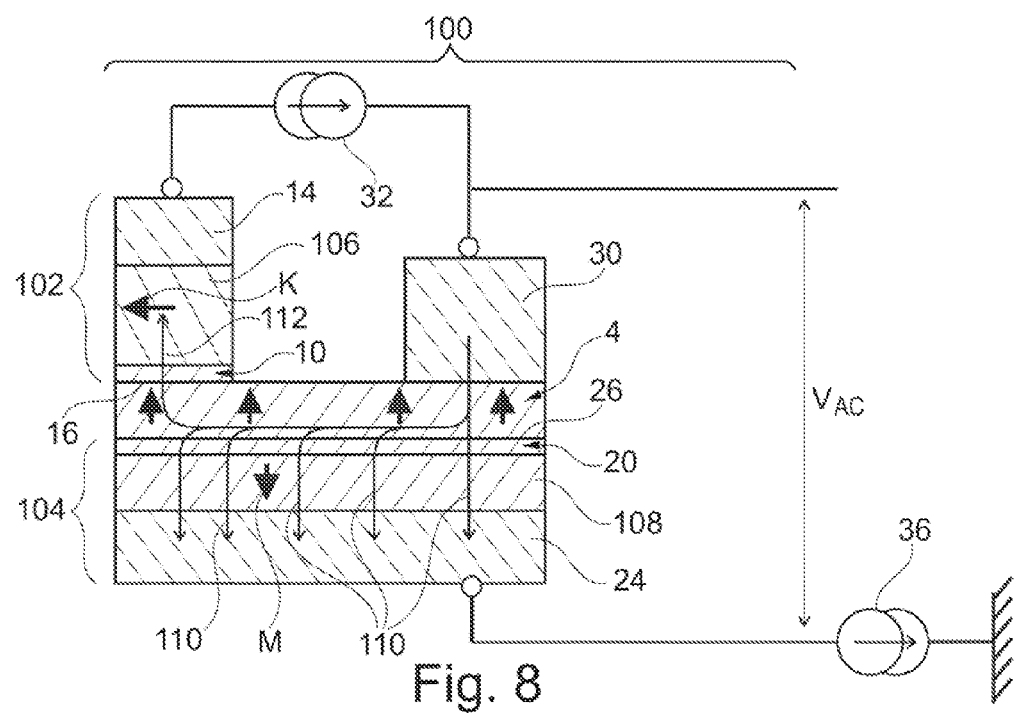

FIG. 8 represents a radiofrequency oscillator 100 which is identical to the radiofrequency oscillator 2 except that the injector 6 and the magnetoresistive contact 8 are respectively replaced by an injector 102 and a magnetoresistive contact 104.

The injector 102 is, for example, identical to the injector 6 except that the polarizer 12 is replaced by a polarizer 106 whose magnetization (arrow K) is parallel to the plane of the free layer 4.

The magnetoresistive contact 104 is, for example, identical to the contact 8 except that the reference layer 22 is replaced by a reference layer 108 whose magnetization is in this case perpendicular to the plane of the layer 4

In this embodiment, the current source 32 is connected between the pad 30 and the electrode 14 of the injector 102. Arrows 110 and 112 schematically represent lines of current flowing through this oscillator 100.

In this embodiment, the polarizer is for example replaced by a pinned reference layer or by an SAF.

Numerous other embodiments are possible. For example, arrangements of the injectors other than that described with reference to FIGS. 6 and 7 are possible. In particular, the various injectors may be concentric rings placed around the pad 30.

As a variant, all the injectors of the embodiment of FIGS. 6 and 7, or only some of them, are connected to the same current source.

The teaching given with reference to FIGS. 6 and 7 may be applied to the oscillators 50, 70 and 80. In the case of the oscillators 50 and 70, a plurality of magnetoresistive contacts are distributed over the upper face of the free layer 4. In the case of the oscillator 80, this leads to increasing, on either side of the same free layer 4, the number of injectors and magnetoresistive contacts whose faces lie entirely apposite one another.

In all the embodiments described, the polarizer may be replaced by a reference layer whose magnetization is pinned in a fixed direction not necessarily perpendicular to the plane of the free layer.

The direction of the current generated by the current source or sources may be reversed, so that the various current lines represented are given here only by way of illustration of a possible mode of operation.

The current source which makes the current flow through the magnetoresistive contact may be omitted if the current which naturally passes through the tunnel barrier is sufficient to make it possible to measure the resistance variation of the tunnel junction.

The two current sources may be replaced by a single current source by connecting the pad 30 and the magnetoresistive contact in parallel to the terminals of a single unique current source. The majority of the current then passes through the injector then the conductive pad, because the tunnel barrier presents a much higher resistivity. This has for example, been represented in the embodiment of FIG. 3.

Irrespective of the embodiment described, the spacer of the injector may be replaced by a tunnel barrier made of insulating nonmagnetic material, so as to form a tunnel junction in combination with the free layer. In this case, in order to maintain good conductivity, the RA factor of the tunnel barrier is preferably selected to be less than 5 $\Omega\mu m^2$.

The conductive pad may be formed by a stack of a plurality of conductive nonmagnetic metals.

The free layer may be formed by a stack of layers. Typically, this stack of layers then forms an SAF.

The invention claimed is:

1. An apparatus comprising a radiofrequency oscillator, said radiofrequency oscillator comprising a free layer having a magnetization that precesses when a spin-polarized current passes through said free layer in a direction perpendicular to a plane thereof, an injector for injecting spin-polarized current into said free layer for causing sustained precession of said magnetization, said injector having a spin-polarized current injection face directly in contact with said free layer, a magnetoresistive contact having a measurement face directly in contact with said free layer to form, in combination with said free layer, a tunnel junction for enabling measurement of said precession, a conductive pad, said conductive pad having a conductivity that is greater than a conductivity of said magnetoresistive contact, said conductive pad being directly in contact with said free layer to cause an electrical current flow through said injector that bypasses said magnetoresistive contact, and a current source electrically connected to at least one of said injector and said magnetoresistive contact, said current source being adapted to cause a current flow having a magnitude that is greater than a magnitude of a critical current $I_c$ above which said magnetization precesses, wherein said injection face and measurement face comprise opposing parts that are arranged opposite one another on either side of said free layer.

2. The apparatus of claim 1, wherein said current source is electrically connected to at least one of said injector and said magnetoresistive contact so as to cause current flow through said opposing parts of said measurement face and said injection face.

3. The apparatus of claim 1, wherein said measurement face extends beyond said injection face.

4. The apparatus of claim 3, wherein said measurement face and said injection face each have a surface and area, and wherein said surface area of said measurement face is at least twice the surface area of said injection face.

5. The apparatus of claim 1, wherein said injection face extends beyond said measurement face in a direction toward said conductive pad.

6. The apparatus of claim 1, wherein said opposing portions of said measurement face and said injection face comprise the entirety of said measurement face and said injection face.

7. The apparatus of claim 1, wherein said oscillator comprises a current source to which said conductive pad and said magnetoresistive contact are connected in parallel.

8. The apparatus of claim 1, wherein an RA factor of a tunnel barrier of said magnetoresistive contact is greater than 1 $\Omega\mu m2$.

9. The apparatus of claim 8, wherein said RA factor is greater than 20 $\Omega\mu m2$.

10. The apparatus of claim 8, wherein said RA factor is greater than 50 $\Omega\mu m2$.

11. The apparatus of claim 1, wherein said injector comprises a polarizer adapted to spin-polarize current that passes perpendicular to a plane of said polarizer and whose direction of easiest magnetization is perpendicular to said plane of said free layer.

12. The apparatus of claim 1, wherein said injector comprises a polarizer and a conductive nonmagnetic layer adapted to magnetically decouple said polarizer from said free layer, thereby causing a stack formed by said polarizer, said conductive nonmagnetic layer, and said free layer to form a giant magnetoresistance.

13. The apparatus of claim 1, wherein said injector comprises a polarizer and an electrically insulating nonmagnetic layer adapted to magnetically decouple said polarizer from said free layer, thereby causing a stack formed by said polarizer, said nonmagnetic layer and said free layer to form a tunnel junction.

14. The apparatus of claim 12, wherein said polarizer comprises a synthetic antiferromagnetic.

15. The apparatus of claim 1, wherein said free layer comprises a synthetic antiferromagnetic.

16. A method for generating radiofrequency oscillations with the aid of a radiofrequency oscillator comprising a free layer having a magnetization that precesses when a spin-polarized current passes through said free layer in a direction perpendicular to a plane thereof, an injector for injecting spin-polarized current into said free layer for causing sustained precession of said magnetization, said injector having a spin-polarized current injection face directly in contact with said free layer, a magnetoresistive contact having a measurement face directly in contact with said free layer to form, in combination with said free layer, a tunnel junction for enabling measurement of said precession, a conductive pad, said conductive pad having a conductivity that is greater than a conductivity of said magnetoresistive contact, said conductive pad being directly in contact with said free layer to cause an electrical current flow through said injector that bypasses said magnetoresistive contact, and a current source electrically connected to at least one of said injector and said magnetoresistive contact, said current source being adapted to cause a current flow having a magnitude that is greater than a magnitude of a critical current Ic above which said magnetization precesses, wherein said injection face and measurement face comprise opposing parts that are arranged opposite one another on either side of said free layer, said method comprising controlling a current source to cause current flow through said opposing parts of said measurement and injection faces and, simultaneously, to cause current flow to bypass said magnetoresistive contact and to flow directly from said injector to said conductive pad.

17. The method of claim 16, wherein said current that passes through the magnetoresistive contact has a magnitude that is at most half the magnitude of current that concurrently flow through said injector.

* * * * *

UNITED STATES PATENT AND TRADEMARK OFFICE
CERTIFICATE OF CORRECTION

PATENT NO.         : 8,766,733 B2                         Page 1 of 1
APPLICATION NO.    : 13/518054
DATED              : July 1, 2014
INVENTOR(S)        : Marie Claire Cyrille et al.

It is certified that error appears in the above-identified patent and that said Letters Patent is hereby corrected as shown below:

In the Claims

In column 12, claim 17, lines 46-49, please amend to read "The method of claim 16, wherein said current that passes through the magnetoresistive contact has a magnitude that is at most half the magnitude of current that concurrently flows through said injector."

Signed and Sealed this
Sixteenth Day of September, 2014

Michelle K. Lee
*Deputy Director of the United States Patent and Trademark Office*